United States Patent

Gandhi et al.

Patent Number: 6,085,415
Date of Patent: Jul. 11, 2000

[54] METHODS TO PRODUCE INSULATED CONDUCTIVE THROUGH-FEATURES IN CORE MATERIALS FOR ELECTRIC PACKAGING

[75] Inventors: Pradeep Gandhi; Samuel Fu, both of Del Mar; Gary E. Legerton, La Masa; Daniel E. Baxter, Leucadia, all of Calif.; William C. Robinette, Ennis, Tex.

[73] Assignee: Ormet Corporation, Carlsbad, Calif.

[21] Appl. No.: 09/123,563

[22] Filed: Jul. 27, 1998

[51] Int. Cl.⁷ .................................................. H01K 3/10
[52] U.S. Cl. ........................ 29/852; 29/830; 156/253
[58] Field of Search .............................. 29/830, 852, 832, 29/840; 156/253

[56] References Cited

U.S. PATENT DOCUMENTS

| | | |
|---|---|---|
| 3,691,632 | 9/1972 | Smith . |
| 4,668,332 | 5/1987 | Ohnuki et al. ...................... 156/630 |
| 4,816,323 | 3/1989 | Inoue .................................. 428/200 |
| 4,830,704 | 5/1989 | Voss et al. .......................... 156/629 |
| 4,868,350 | 9/1989 | Hoffarth et al. . |
| 4,997,698 | 3/1991 | Oboodi et al. . |
| 5,208,068 | 5/1993 | Davis et al. . |
| 5,231,751 | 8/1993 | Sachdev et al. .................... 29/852 |
| 5,421,083 | 6/1995 | Suppelsa et al. .................. 29/852 |
| 5,451,721 | 9/1995 | Tsukada et al. .................. 174/261 |
| 5,502,893 | 4/1996 | Endoh et al. ...................... 29/852 |
| 5,736,679 | 4/1998 | Kresge et al. .................... 174/250 |

*Primary Examiner*—Carl J. Arbes
*Attorney, Agent, or Firm*—Gray Cary Ware & Freidenrich LLP; Stephen E. Ritter; Ramsey R. Stewart

[57] ABSTRACT

Methods for the production of insulated, conductive through-features in conductive core materials for electronics packaging are disclosed. Invention methods employ protective mask technology in order to facilitate the selective removal of material from planar conductive core material that has been encapsulated in electrically insulated materials. By filling the cavity in the conductive core material with an electrically insulated material, the through-feature is electrically isolated from the remainder of the core material. In this manner, a conductive through-feature that completely transverses the core of the substrate board is created. Also provided are planar substrates for multilayer printed circuit boards, or chip carriers, comprising the conductive through-features produced by invention methods.

31 Claims, 4 Drawing Sheets

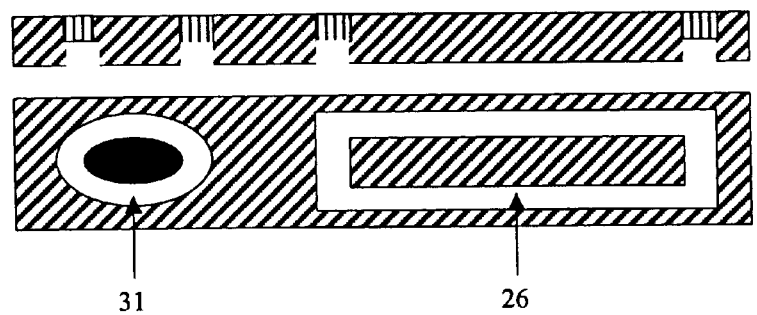

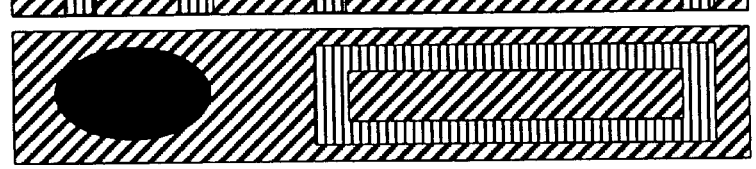

METHODS TO PRODUCE INSULATED CONDUCTIVE THROUGH-FEATURES IN CORE MATERIALS FOR ELECTRIC PACKAGING

FIELD OF THE INVENTION

The present invention relates to methods of forming insulated, electrically conductive through-features within conductive core materials. In another aspect the present invention relates to the area of high density, electronic substrates, specifically printed wiring boards (P.W.B.'s) and chip carriers with an emphasis on electrical interconnections through the thickness of the core material.

BACKGROUND OF THE INVENTION

Printed Wiring Board (PWB) technology relies primarily upon copper-plated, drilled holes known as "through holes" to make connections from one surface of the board to the other. The most common configuration of a PWB consists of a glass weave reinforced epoxy, polyester or phenolic resin core, sheets of copper that have been laminated to either surface of the core and selectively etched into circuit patterns, and mechanically drilled through-holes with diameters on the order of 8 mil to 30 mil that have been subsequently plated with copper to connect to the circuitry on either side. In more sophisticated PWB's, there is often a need for additional layers of circuitry to make all of the necessary interconnections. In this case, a multiplicity of core substrates with circuitry on both sides are interleaved with unmetalized electrically insulating cores and laminated together into a monolithic structure. This structure is subsequently mechanically drilled through the entire thickness of the stack, and copper is plated into the holes to form interconnections between layers of circuitry.

This type of multilayered printed wiring board construction necessitates large "capture" features to be incorporated into circuit layers so that misplacement of the drill bit and/or misalignment of the layers, within reasonable tolerances, will not result in missed connections and unacceptable yield losses. These capture pads take up considerable area on each circuit layer resulting in significant loss of available space for additional circuitry or component attachment sites. There is additional loss of available space for circuitry on the innerlayers since, although not all circuit layers require interconnection at every drilled vertically interconnected assembly (via) location, the holes must extend through the entire thickness of the stack. Some of the lost area can be recovered by the use of smaller drill bit sizes, however, mechanical drilling becomes cost prohibitive below 8mil diameter holes due to bit breakage.

The incentive to develop improved PWB technologies has increased dramatically in the last decade for two primary reasons: First, the number of components and the number of output sites for each component has increased dramatically, resulting in orders of magnitude more attachment points per area of printed wiring board. Second, there is a drive to reduce the cost of packaged integrated circuits by building such packages using PWB technology instead of ceramic technology. Both of these factors create a need for PWB technology with higher circuit density.

A number of technologies are under development to address the increased circuit density requirements. Several of these methods rely upon the use of direct layer-to-layer interconnections instead of creating vertical electrical interconnection by drilling through the entire stack. In most of these methods, thin layers of a polymeric dielectric material replace thick cores in multilayer constructions. Vias are created by forming holes in individual layers of dielectric, either as a freestanding layer, or after the layer has been applied to previous layers. The vias thus formed are either coated or filled with a conductive medium such as copper or silver-filled epoxy, thus creating a conductive "microvia." The defining characteristic of a microvia is that it serves to connect two circuit layers in immediate proximity to one another, and no others, and that it has a diameter of less than 10 mil.

Coated microvias result in a dimple type topology whereas filled microvias form a solid plug that is co-planar with the upper conductive surface. Filled microvias are advantageous because they do not cause deformations in overlying circuit layers, they form more robust connections, and they can be stacked directly on top of one another from one circuit layer to the next, thus resulting in higher overall density capabilities and shorter circuit pathways. The problem with most of these filled via technologies is that they employ metal particulate-filled polymers as the conductive via fill material. These materials are deficient in that they do not typically share the expansion characteristics of the core substrates or inner layer dielectric, they tend to have entrapped voids when deposited into deep holes, and they suffer from loss of electrical conductivity in hot and/or humid conditions due to loss of contact between the particulates. Even when conduction pathways remain intact, they are inferior to those provided by pure metal conductors.

The use of microvias in thin dielectrics to form multilayer PWBs has resulted in very high density electronic modules with average feature sizes that are five times smaller than were typical only a few years ago. In fact, the feature sizes have decreased to the point that surface topography created by the glass-weave reinforcement in the core substrate is beginning to distort feature definition and signal propagation characteristics. Planarization of the core substrate and each intermediate layer is becoming critical for cutting edge, high density applications. The use of area array component attachment technology also acts as a driver for overall planar modules since the solder balls used to connect such devices are inherently less forgiving to surface topography than conventional metal leads. Elimination of the thick core board might seem a solution to this dilemma, however, often a thick substrate is required to provide adequate mechanical strength and dimensional control to the entire PWB structure.

In addition to planarity and density concerns, heat has become an issue for high density PWBs from two perspectives. From an external perspective, portable electronics and increasingly electronically-driven transportation systems require electronic modules to perform reliably in much more demanding environmental conditions. These operating conditions have necessitated the development of more stringent reliability assessment tests than have typically been administered. Electronic modules and subsystems are now routinely tested to 150° C. instead of the previous standard of 125° C.

The increased 150° C. temperature for thermal cycling and shock requirements is far in excess of the glass transition temperatures of most resins used in the manufacture of core substrates. Polymer resins expand roughly linearly with temperature until their glass transition temperatures, after which, the rate of increase of expansion generally increases several fold. The expansion of the polymer resins used in core substrates during thermal excursions is mitigated in the plane of the circuit traces by the influence of the woven reinforcement material, typically glass, which has a low and stable expansion. In the axis perpendicular to the circuit layers, however, the plies of woven reinforcement are not interconnected and the resin is free to expand to its full extent. This expansion creates a considerable amount of stress on the through holes or vias in the core substrate since the conductive material possesses different expansion characteristics than the core resin. Eventually, with repeated thermal cycling, the conductive material within the vias separates from the planar circuit layers resulting in catastrophic failure.

The second heat issue is internally generated heat. Devices are packed so closely together on high-density PWBs that there is insufficient airflow to convectively carry away waste heat generated by the working devices. This problem is exacerbated by the new, more powerful IC devices, since every generation creates higher wattages over smaller effective areas. Heat sinks and active cooling devices often have to be connected to the module, and in some cases even the device, in order to effectively dissipate the heat generated so that it does not affect the module performance and life span. These cooling mechanisms are expensive, bulky, and have a detrimental effect on overall yield in manufacture.

In order to address the planarity, dimensional stability and thermal management concerns, several technology developers have turned to insulated metal substrates as core materials. Depending on the thermal dissipation requirements, substrates such as copper, aluminum, or metal matrix composites can be employed. Specific materials may be chosen based upon having expansion characteristics that match some other element in the electronic module that is of particular concern in fatigue resistance, for instance, an IC device that is directly attached to the substrate by solder balls in a "flip chip" arrangement.

Typically, the thermally and electrically conductive core materials are electrically insulated using a polymer resin that has been filled with a thermally conductive particulate material or using an inorganic coating such as glass or ceramic. Use of a conductive substrate provides some additional benefits such as high transition temperatures for changes in dimensional characteristics, less absorption of contaminate materials and inherently included power or ground planes.

Metal core substrate technology has not been widely adopted, despite its many advantages, because there is currently no accepted technique for creating insulated metal features through the thickness of the core. This deficiency necessitates that all circuitry be built on one side of the substrate. These deficiencies result in lower overall circuit density, and significant stress and camber issues if a larger number of layers of circuitry are required.

Thus, there exists a need in the industry for a technology that can utilize metal and metal matrix composite substrates in the manufacture of high density, multilayer electronic packaging. In order to satisfy industry requirements and provide significant market advantage such a technology must be simple, rugged, high-yield, cost effective, able to leverage existing PWB infrastructure, be compatible with multilayering technologies already under development, be capable of providing small through-vias and be able to utilize both surfaces of the substrate.

OBJECTS OF THE INVENTION

It is therefore an object of the present invention to provide methods by which conductive features can be derived, but insulated from, a conductive core material for use in electronic packaging substrates such as PWBs and chip carriers.

It is a further object of the invention to provide methods to create the aforementioned conductive features in such a manner that the resulting article is planar in surface topography in order to facilitate the subsequent addition of one or multiple circuit layers by any method known to those skilled in the art.

It is a further object of the invention to create the aforementioned features using materials, processes and equipment that are commonly available in the industry.

It is yet a further object of the invention to provide methods by which the aforementioned features can be formed such that they possess small dimensions relative to those achievable by prior art methods.

It is yet another object of the invention to provide electronic packaging substrates in which the through-features are more thermally and mechanically robust and provide better electrical performance than those achieved by the use of prior art methods.

These and other objects of the invention will become apparent upon inspection of the specification and appended claims.

BRIEF DESCRIPTION OF THE INVENTION

Therefore, in accordance with the present invention, there are provided methods for the production of insulated, conductive through-features in conductive core materials for electronics packaging. Invention methods employ protective mask technology in order to facilitate the selective removal of material from substantially planar conductive core material that has been encapsulated in electrically insulated materials. By partially isolating the through-features and subsequently filling the cavity in the conductive core material with an electrically insulating material, the through-feature is sufficiently fixed so that the remainder of the core material that attaches the through-feature to the conductive core can be removed. The remaining cavity can be filled with the same or a different insulator than was used to fill the cavity created by the first removal of core material. In this manner, a conductive through-feature that completely transverses the core of the substrate board can be electrically isolated from the substrate core material.

In accordance with another aspect of the invention, there are provided planar substrates for multilayer printed circuit boards, or chip carriers, comprising conductive through-features that transverse the electrically conductive core of the substrate, yet are electrically insulated from the remainder of the core material.

In accordance with yet another embodiment of the invention, there is provided a multilayer printed circuit board, or chip carrier, incorporating one or more substrates comprising conductive through-features, as described above.

As those of skill in the art will recognize, invention methods facillitate the construction of circuit boards and electronic componentry with a minimal number of processing steps, while at the same time, maximizing the use of available space.

BRIEF DESCRIPTION OF THE FIGURES

FIG. 8 depicts the conductive copper core material (10) of FIG. 7, which has been coated onto all sides with a protective mask (15), such as a photoresist material or the like.

DETAILED DESCRIPTION OF THE INVENTION

Figure 1:
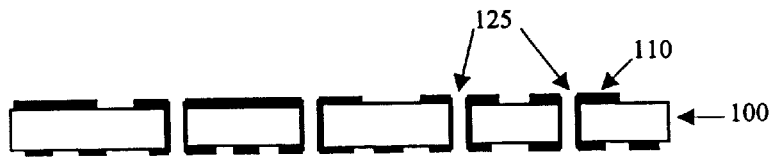
FIG. 1 depicts a prior art, standard double sided PWB with plated copper through-holes (125) and a reinforced polymer core (100) with copper circuit traces and capture pads (110) etched from copper foil that has been laminated to both sides of the reinforced polymer core.
Figure 2:
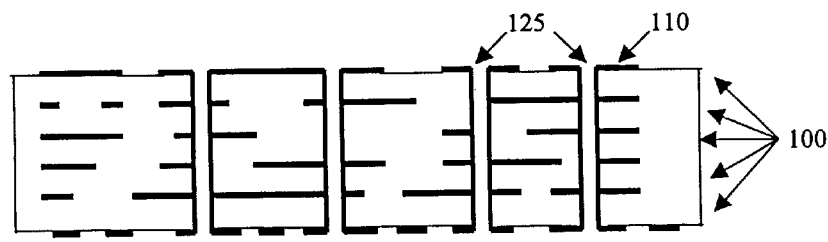
FIG. 2 depicts a prior art, multilayer PWB produced from five individual reinforced polymer cores (100), that have been laminated together, drilled and through-hole plated with copper (125).
Figure 3:
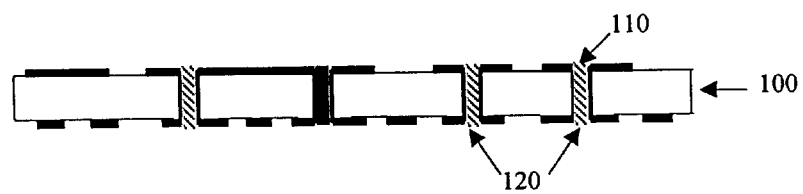
FIG. 3 depicts a prior art, double sided PWB as in FIG. 1, that has copper plated through-holes filled with a conductive or non-conductive polymer-based material (120).
Figure 4:
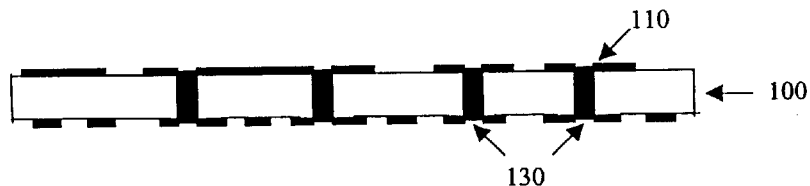
FIG. 4 depicts a prior art, reinforced polymer core, double sided PWB as in FIG. 1, with the exception that the through-holes have not been copper-plated. The through-holes have been filled with a material (130) which is electrically conductive.
Figure 5:
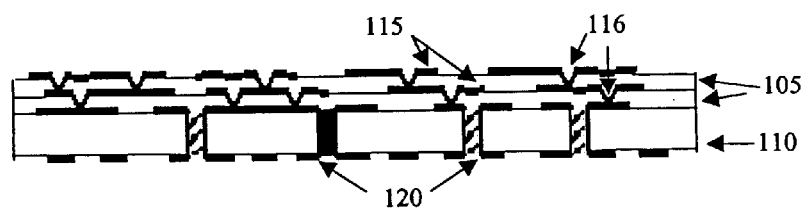
FIG. 5 depicts a prior art reinforced polymer core, double sided, filled through-hole PWB as in FIG. 3 with two additional layers of polymer dielectric (105), and two plated layers of copper circuitry (115) connected by copper-plated microvias (116) formed during the plating process to afford a high circuit density substrate.
Figure 6:
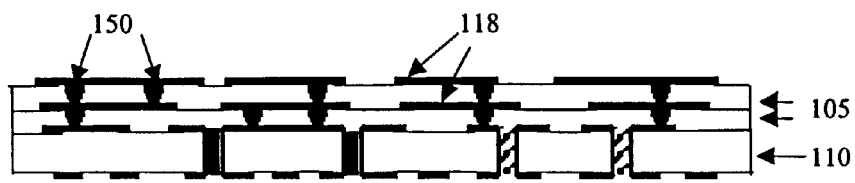
FIG. 6 depicts a prior art variant of surface added, high circuitry density layers as in the structure of FIG. 5. The surface added circuit layers of FIG. 6 consist of two layers of polymer dielectric (105) with circuit traces of etched copper foil (118) interconnected by microvias filled with an electrically conductive composite material (150).
Figure 7:
FIG. 7 illustrates substantially planar conductive core material (10) of the present invention.
Figure 8:
Figure 9:
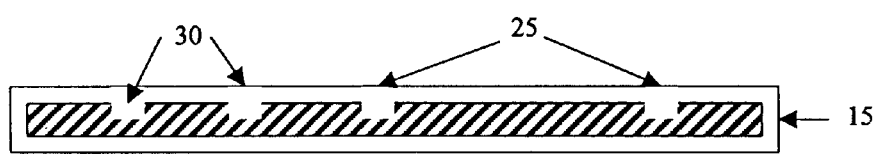
FIG. 9 depicts the coated conductive core wherein the protective mask has been selectively patterned to reveal the underlying core material which has been, in turn, selectively removed to a pre-determined depth, thus creating cavities (25, 30).
Figure 10:
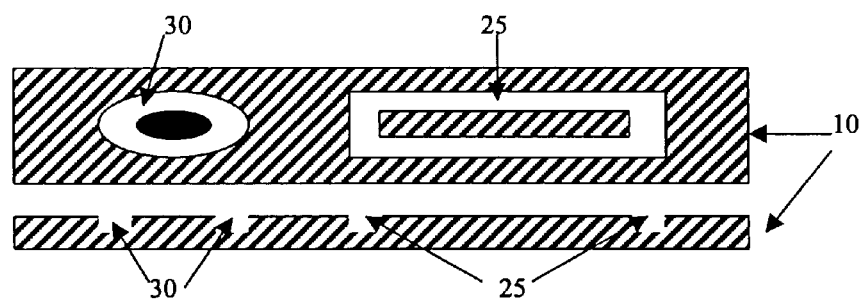
FIG. 10 shows top and side views of the patterned core material of FIG. 9 after the protective mask (15) has been stripped away. The cavities (25, 30) created by the selective removal of core material are illustrated.
Figure 11:
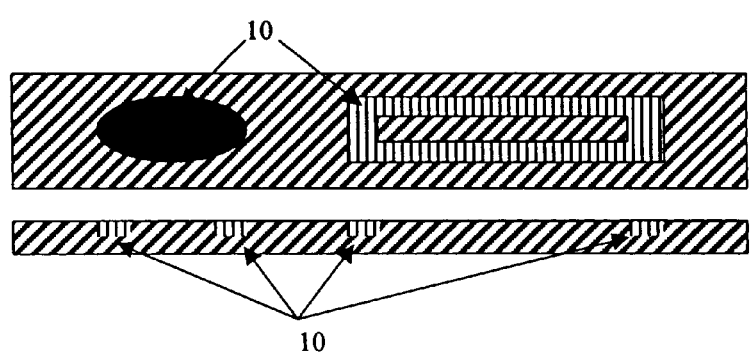
FIG. 11 shows top and side views as in FIG. 10 wherein the cavities in the core material have been filled by an insulative material (10).
Figure 12:
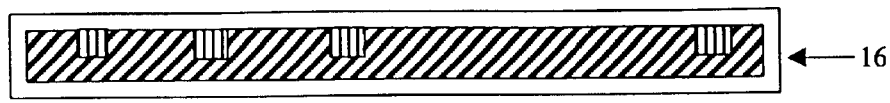
FIG. 12 depicts the filled core of FIG. 11 wherein a second protective mask (16) has been applied to the core material.
Figure 13:
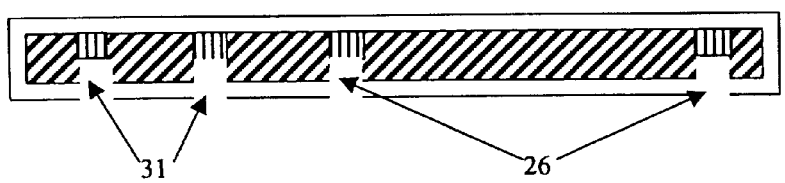
FIG. 13 illustrates the masked board of FIG. 12 wherein the protective mask has been selectively patterned and the underlying core material removed, thus creating cavities (26, 31).
Figure 14:
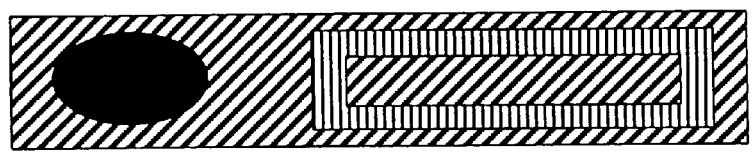
FIG. 14 depicts the top side and bottom views of the core material of FIG. 13, wherein the protective mask has been completely stripped off.
Figure 15:
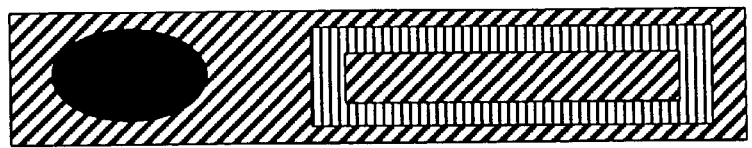
FIG. 15 depicts the top side and bottom views of the core board of FIG. 14, wherein the cavities (26, 31) have been filled with an insulative material.
Figure 16:
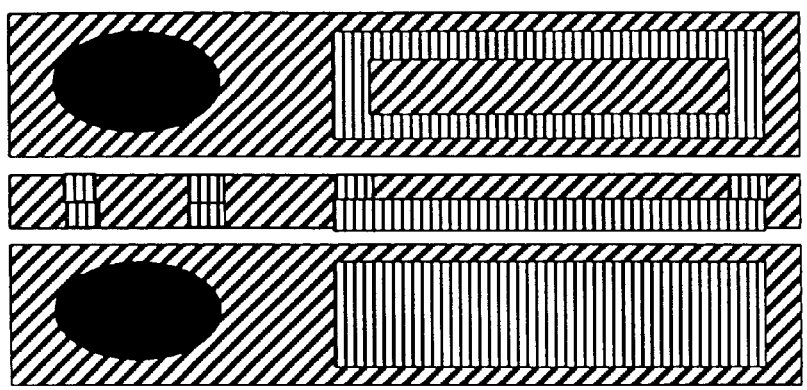
FIG. 16 illustrates top, side and bottom views of a patterned and insulated conductive board as in FIG. 15, wherein, however, the pattern of removal of core material from the bottom of the board differs from that of the top of the board. Thus, the bottom cavity (40) is different from that of the top cavity (26).
Figure 17:
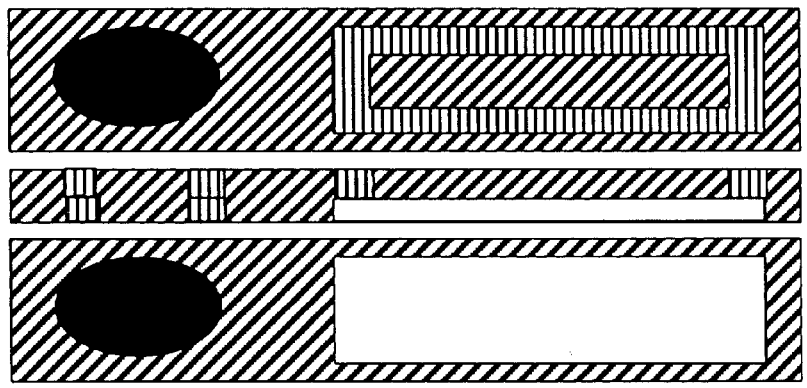
FIG. 17 depicts the top side and bottom views of the board shown in FIG. 16 wherein, however, the bottom cavity employs a gas (45) as the insulative material.

In accordance with the present invention, there are provided methods for the production of insulated, conductive through-features in conductive core materials for electronic packaging. The invention method comprises:

a. Filling a cavity in conductive core material with a first electrically insulative material;
   (i) wherein said conductive core material is substantially planar and wherein a portion of said conductive core material has been selectively removed, thereby creating said cavity so that a through-feature is partially isolated from the remainder of the conductive core material;

b. Selectively removing sufficient conductive core material to completely isolate said through-feature from the remainder of the conductive core material; and c. Filling the remainder of the cavity left unfilled with the first electrically insulative material with a second electrically insulative material. While the first and second electrically insulative materials can be the same, they need not be the same.

In another embodiment of the present invention, the surface of the cavity is contacted with an adhesion-promoting substance prior to step (a) and/or (c). Suitable adhesion promoting substances include compounds comprising one or more of an oxide of the core material, an organosilane, an organotitanate, a chromium-containing compound, and the like.

As will be appreciated by those skilled in the art, conductive core materials contemplated for use in the present invention can be selected from a variety of materials, taking into consideration such factors as specific thickness, coefficient of thermal expansion, melting temperature, hardness, cost, electrical conductivity, thermal conductivity, and the like. In one embodiment of the invention, the core material can be any metal or metallic composite material that is isotropic, solid throughout all processing and operating conditions, and possesses suitable electrical and thermal conductivity.

As will also be appreciated by those of skill in the art, the particular endproduct and its application will impact on the operating temperature, and also dictate the electrical and thermal conductivity requirements of the conductive core materials. Likely processing and operating temperatures are in the range of about −100° C. up to about 350° C., depending upon the end-product and its application. Suitable ranges for thermal conductivity are from about 2 up to about 2000 W/m*K, and, for electrical resistivity, less than about 10 Ohm*cm.

Exemplary metallic materials contemplated for use in the practice of the present invention include copper, aluminum, steel, stainless steel, brass, copper-tungsten, bronze, iron, nickel, titanium, mumetal (an alloy of iron, nickel and copper which may contain trace amounts of either chromium or molybdenum), alloys of iron, nickel and cobalt, alloys of iron, nickel and carbon, and the like. Exemplary metal composite materials contemplated for use in the present invention include aluminum-infiltrated silicon carbide, aluminum nitride, metal-infiltrated graphite, metal particle filled glass, metal particle filled ceramic, metal particle filled polymers, resin-impregnated metal mesh, air-filled metal mesh, and the like.

Thickness requirements for conductive core materials contemplated for use in the practice of the present invention are dependent upon a number of factors, including mechanical support requirements for the overall substrate, thermal dissipation requirements, desired dimensions for feature resolution, and the like. With regard to feature resolution, the thickness of the core generally limits the lower limit of feature dimensions that can be resolved through the thickness of the core. As will be understood by those skilled in the art, this dependency is more pronounced with some selective removal techniques, such as chemical etching, than with others, for example, laser machining.

In a first embodiment of the present invention, in order to resolve the through-features, portions of the conductive core material are selectively removed from one side of the planar substrate to a chosen depth. As will be appreciated by those skilled in the art, any number of methods for selective removal of core material may be employed. The resulting conductive feature will be derived from the core and isolated around its entire perimeter to some pre-determined percentage of the core's total thickness. The conductive feature will thereby remain attached to the core, with the bottom portion of the conductive through-feature not yet differentiated around its entire perimeter from the surrounding conductive core material. Following addition of the first electrically insulating material, the remainder of the through-feature is resolved by selective removal of conductive core material necessary to affect such resolution. The second electrically insulating material is then filled into the resulting cavity.

In a second embodiment of the present invention, conductive core material is selectively removed through the entire thickness of the substrate, yet leaving the through-feature partially resolved when viewed from above the surface of the substrate. The through-feature thereby remains attached to the substrate, at a portion of the perimeter of the feature, through the entire thickness of the substrate. Following addition of the first electrically insulating material, the remainder of the through-feature is resolved by selective removal of conductive core material necessary to affect such resolution. The second electrically insulating material is then filled into the resulting cavity.

Selective removal techniques contemplated for use in the present invention include chemical etching, mechanical abrasion, laser etching, machining, and the like, as well as combinations of such techniques. In one embodiment of the present invention, a protective photolithographic polymer mask is employed in conjunction with the chemical or laser etching technique, when used. In another embodiment of the present invention, a protective ceramic mask is employed in conjunction with chemical etching techniques. The ceramic mask can be formed by selective anodization of the conductive core material surrounding the area to be chemically etched. As will be appreciated by those skilled in the art, the mask employed must be more resistant to the etching technique than the core conductive material. For example, a mask employed in mechanical abrasion of the conductive core should be more resistant to mechanical abrasion than is the conductive core material. In another embodiment of the present invention, an adherent metal layer is applied to the surface of the conductive core material and is then patterned for use as a mask. This type of mask is particularly useful when employing chemical etching. Exemplary adherent metals include tin, nickel and the like.

The cavities formed from the selective removal of core material are filled with an insulative material used to electrically isolate the conductive through-features from the conductive core. In one aspect of the present invention, the insulative material is a liquid or paste prior to application and processing, wherein the material solidifies during processing and becomes adherent to the core material. The insulative material must be responsive to processing conditions to affect its solidification that are compatible with the physical properties of the conductive core material. The insulative material must further remain solid throughout all subsequent processing steps and operating environments, must be relatively void-free and have adequate mechanical strength to hold conductive features in place during subsequent processing and use, and must further possess adequate electrical characteristics for the intended application. Electrical characteristics of interest include dielectric strength, dielectric constant, loss tangent, coefficient of thermal expansion, and the like. Those of skill in the art can readily identify suitable insulative materials including polymer resins, inorganic/organic hybrid polymers, glasses and other solvated inorganic materials, or any other suitable material known to those skilled in the art, either filled or unfilled with particulate matter.

Exemplary electrically insulative materials are characterized as having:

a. A $T_g$ in the range of about 140° C. up to about 450° C.;
b. The ability to adhere to the conductive core material within the temperature range encountered in further processing and use (typically in the range of about 100° C. up to about 300° C.);
c. A dielectric constant less than about 6.0;
d. A dissipation factor of less than about 0.02 at 1 Mhz; and
e. A volume resistivity greater than about $1 \times 10^9$ $\Omega$*cm. The second electrically insulative material can be the same as, or different from, the first electrically insulative material. The second electrically insulative material will preferably have the same characteristics as specified above for the first electrically insulative material, however, the second electrically insulative material may also be a gas, such as, for example, air, nitrogen or argon.

Exemplary organic electrically insulative materials are high performance thermoplastic and thermosetting resins such as, for example, epoxies, cyanate esters, polyimides, bismaleimides, cyclic hydrocarbons, polyetherimides, polybenzimidazoles, polyarylethers, polyethersulfones, aromatic polyamides, and the like, as well as derivatives and combinations thereof. Such compounds include, for example, multifunctional epoxy compounds available from Dow, Ciba-Geigy, Shell and EpoTek, Ultem™ polyetherimide from GE, Probimide™ polyamic acids from Ciba-Geigy, Compimide™ bismaleimides from Shell, Avatrel™ cyclic hydrocarbons from BF Goodrich, Cyclotene™ benzylcyclobutenes from Dow, and the like.

In a preferred embodiment of the present invention, first and second electrically insulative materials have coefficients of thermal expansion that nearly match the coefficient of thermal expansion of the core material. This may be acheived by using compounds with the desired coefficient of thermal expansion. Alternatively, such resins are filled with particulate matter, such as, for example, fumed silica, boron nitride, crushed glass, ceramic powders, glass or ceramic hollow spheres, mica and/or other minerals in order to effect such a match of coefficients of thermal expansion. In an especially preferred embodiment, the coefficient of thermal expansion of said first and second electrically insulative materials is within about $\mp 50$ ppm/° C. of the coefficient of thermal expansion of the conductive core material over the temperature range of interest.

Exemplary insulative inorganic compound(s) include, for example, glass comprising one or more of lead oxides, soda ash, potash, silica, and the like.

As will be appreciated by those skilled in the art, preferred insulative materials will, after processing to affect solidification, possess glass transition temperatures that are in excess of all subsequent process and operating temperatures. Such temperatures will be in the range of about −100° C. up to about 350° C.

In one embodiment of the present invention gas may be used to electrically insulate conductive features from the conductive core. In such an embodiment, a first electrically insulative material meeting the criteria as described herein would be employed to electrically isolate the top portion of the conductive feature from the conductive core material, and would also serve to adhere the conductive feature to the conductive core material. However, the bottom portion of the feature would be electrically isolated from the core by a gas, and would not be adhered to the core in any fashion. Such a construction might be useful, for example when the lowest possible dielectric constant for the insulative material confers a substantial performance improvement, such as in microwave applications.

As will be understood by those skilled in the art, certain embodiments described herein may result in residue of the chosen insulative material remaining on the surface after the insulative material has been filled into the cavities. Such residue may be removed by any suitable method, including mechanical abrasion, abrasion by high pressure liquid spray techniques, chemical removal by salvation or degradation, and the like.

The invention will now be described in greater detail by reference to the following non-limiting examples.

EXAMPLES

Example 1

An experiment was performed to determine the minimum feature size and insulating ring width combination that would consistently result in a conductive through feature with substantially straight wall sides through the thickness of the conductive core. The test pattern consisted of cylindrical through vias with feature diameters ranging from 0.002 inches to 0.014 inches and insulating rings 0.001 to 0.008 inches in width. The core thickness used for this experiment was 0.01 inches and the etchant was a standard, commercially available mixture of hydrochloric acid in hydrogen peroxide that is commonly sold as an etchant for copper metal and alloys.

The samples were fabricated by first obtaining copper sheet material 0.01 inches in thickness that was substantially planar (±0.002 inches in thickness and planarity variations). These substrates were mechanically abraded with 1200 grit sand paper to remove any processing oils and native oxides and to provide a roughened surface for robust adhesion to the photoresist. A commercially available photoresist from Dynachem in Irvine, California was then applied as a film using a roll laminator apparatus. A mylar mask was created with a black ink coating in the pattern of the insulative rings. The mask was overlaid on the photoresist film and imaged with UV light according to the manufacturer's recommendations. The photoresist was then selectively removed from the copper in the pattern of the insulative rings utilizing an alkaline bath provided by the photoresist manufacturer for this purpose. The copper that was exposed by the removal of the photoresist was etched by passing through a bath of hydrochloric acid in hydrogen peroxide five times. Each pass through the bath had a dwell time in the etchant of about 2 minutes and each pass was followed by a neutralizing rinse.

After five passes through the etchant, the remainder of the photoresist was stripped off using a product supplied by the manufacturer for this purpose. The cavities that were formed in the etched side of the substrate were filled with an epoxy-acrylate mixture supplied by Enthone Corporation. This epoxy-acrylate insulator was cured at 150° C. for one hour, after which the entire sequence was repeated to form the cavities on the other surface of the copper and thereby attempt to fully isolate the cylindrical features from the copper core.

The results for the various geometries are as follows:

A=the insulating ring feature could not be resolved in the photoresist to reveal the copper B=the conductive feature was either partially or fully dissolved into the etchant bath C=the feature was partially isolated D=the feature was fully isolated and had substantially straight side walls

|                        | Feature diameter (0.00X inches) |   |   |   |   |   |   |   |   |    |    |    |    |    |
|------------------------|---|---|---|---|---|---|---|---|---|----|----|----|----|----|
| Ring Width (0.00X inches) | 1 | 2 | 3 | 4 | 5 | 6 | 7 | 8 | 9 | 10 | 11 | 12 | 13 | 14 |
| 1 | A | A | A | A | A | A | A | A | A | A | A | A | A | A |
| 2 | A | A | A | A | A | A | A | A | A | A | A | A | A | A |
| 3 | B | B | B | B | B | B | B | C | C | C | C | C | C | C |
| 4 | B | B | B | B | B | B | B | C | C | C | C | D | D | D |
| 5 | B | B | B | B | B | B | C | C | C | D | D | D | D | D |
| 6 | B | B | B | B | B | B | C | C | D | D | D | D | D | D |
| 7 | B | B | B | B | B | B | D | D | D | D | D | D | D | D |
| 8 | B | B | B | B | B | B | D | D | D | D | D | D | D | D |

These results suggest that the particular photoresist employed herein cannot adequately resolve feature sizes smaller than about 0.003 inches in width and that widths of about 0.005 inches are required for consistent resolution. The other conclusion is that, due to the isotropic nature of chemical etching, the minimum feature size that can consistently be isolated with substantially straight side walls has a diameter at least equal to the thickness of the substrate. Thus for circuit applications requiring high circuit density and small feature sizes, a relatively thin sheet of core metal is preferably used.

Example 2

The same experiment was performed as in Example 1 except that the etchant employed was a ferric chloride solution. The purpose of this experiment was to determine the specificity of the process to known copper etchant solutions. The results of the experiment were substantially identical to those in Example 1 based on 10X magnified visual inspection.

Example 3

An experiment was performed according to the same methodology as described in Example 1 except that the feature diameter was held constant at 0.010 inches and the insulative ring width was held constant at 0.005 inches. The purpose of this experiment was to ascertain the minimum practical spacing which could be achieved between conductive through features without detrimental effects on the mechanical and dimensional integrity of the substrate. The spacing from center to center of the through features was varied from 0.020 to 0.060 inches in 0.010 increments. A spacing between about 0.030 and about 0.040 inches was determined to be the practical limit under the experimental conditions. Establishment of these limits was based upon observations of substrate warping and the damage incurred in handling.

Example 4

The same experiment was performed as described in Example 1 except that 'half-hard copper' and 'fall-hard copper' (copper with certain impurities to improve hardness) were substituted for the pure soft copper. The same results were achieved for both materials as were observed in Example 1 with the added benefit of substantially improved dimensional control and reduction in handling damage. These results indicate that the invention techniques can be applied using a variety of metallic materials.

Example 5

The same experiment was performed as described in Example 3 except that the feature spacing was held constant at 0.040 inches and the substance utilized as the insulating material was varied. On each sample, the same insulative material was used in both the first and second cavities formed. The insulative materials evaluated were (1) an epoxy-acrylate polymer with a glass transition temperature of 140° C. and a low cure shrinkage (<1%) and (2) a multifunctional epoxy material with a glass transition temperature of 220° C. and a relatively high cure shrinkage (2–3%). Each of the formulations was evaluated both with and without ceramic filler. The evaluative criteria for this experiment were mechanical distortion of the copper substrate with cured insulator after thermal cycling from 20° C. to 220° C. five times, and observable delamination of the insulator from either the feature or the core after such cycling. No delamination was observed for all four samples. The ceramic filled insulator samples demonstrated less overall distortion of the substrate after cycling. Glass transition and shrinkage seem to have equal effect on distortion since comparable results were achieved for the two substantially different insulator formulations.

Example 6

Starting with the test vehicles from Example 5 which contained the ceramic-filled epoxy-acrylate insulator, 14 layer multilayer circuits were built. Seven additional layers of circuitry and microvias were added to either side of the copper core. Prior to addition of the additional circuit layers, the copper core was electrically insulated leaving openings for the conductive through features using the same epoxy-acrylate material used to isolate the through features. No defects in the multilayer circuits were noted and electrical interconnection was successfully established between the through features and the overlying circuitry.

While the invention has been described in detail with reference to certain preferred embodiments thereof, it will be understood that modifications and variations are within the spirit and scope of that which is described and claimed.

That which is claimed is:

1. A method for the production of insulated, conductive through-features in conductive core materials for electronics packaging, said method comprising:
   a) filling a cavity in conductive core material with a first electrically insulative material,
      i) wherein said conductive core material is substantially planar and wherein a first portion of said conductive core material has been selectively removed, thereby creating said cavity so that a through-feature is partially isolated from the remainder of the conductive core material,
   b) selectively removing a second portion of said conductive core material to completely isolate said through-feature from the remainder of the conductive core material, and
   c) filling the remainder of the cavity left unfilled with the first electrically insulative material with a second electrically insulative material.

2. A method according to claim 1, wherein said selective removal of said first portion of the conductive core material is from a first side of said plane, to a pre-determined depth around the entire perimeter of the through-feature, such that the through-feature remains attached around its entire perimeter to the remainder of the conductive core material.

3. A method according to claim 1, wherein said first portion of the conductive core material is selectively removed through the entire thickness of the conductive core material, yet leaves the through-feature attached to the remainder of the conductive core material by a predetermined percentage of the perimeter of the through-feature.

4. A method according to claim 1, wherein said conductive core material is a metal or a metallic composite.

5. A method according to claim 1, wherein said conductive core material remains isotropic and solid when subjected to temperatures encountered in further processing and use.

6. A method according to claim 4, wherein said metal is copper, aluminum, steel, stainless steel, brass, copper-tungsten, bronze, iron, nickel, titanium, mumetal, an alloy of iron, nickel and cobalt, or an alloy of iron, nickel and carbon.

7. A method according to claim 4, wherein said metal composite is aluminum-infiltrated silicon carbide, metal-infiltrated graphite, metal particle filled glass, metal particle filled ceramic, metal particle filled polymers, resin-impregnated metal mesh, aluminum nitride or air-filled metal mesh.

8. A method according to claim 1, wherein said first and/or second electrically insulative material is characterized as having:
   a) a $T_g$ in the range of about 140° C. up to about 450° C.,
   b) the ability to adhere to the conductive core material within a temperature range of about −100° C. up to about 300° C.,
   c) a dielectric constant less than about 6.0,
   d) a dissipation factor of less than about 0.02 at 1 Mhz, and
   e) a volume resistivity greater than about $1 \times 10^9$ Ω*cm.

9. A method according to claim 1, wherein said second electrically insulative material is a gas.

10. A method according to claim 9, wherein said gas is air, nitrogen or argon.

11. A method according to claim 5, wherein said temperatures fall in the range of about −100° C. up to about 350° C.

12. A method according to claim 1, wherein following step (b) and/or step (c), one or more layers of circuitry are applied to said first and/or second sides of said conductive core material, thereby producing a multilayer printed circuit board.

13. A method according to claim 1, wherein following step (b) and/or step (c), said method further comprises removing any residue of said first and/or second electrically insulative material that remains adhering to said first and/or second surfaces of said conductive core material.

14. A method according to claim 13, wherein said first and/or second electrically insulative material is removed by mechanical abrasion, high pressure liquid spray techniques, or chemical removal.

15. A method according to claim 1, wherein said selective removal of said core conductive material is carried out by chemical etching, mechanical abrasion, laser etching, and/or machining.

16. A method according to claim 15, wherein a protective phololithographic polymer mask is employed in said chemical or laser etching technique.

17. A method according to claim 15, wherein a protective ceramic mask is employed in said chemical etching technique.

18. A method according to claim 17, wherein said ceramic mask is formed by selective anodization of the conductive core material surrounding the area to be etched.

19. A method according to claim 15, wherein a mask more resistant to mechanical abrasion than the conductive core material is employed in said mechanical abrasion technique.

20. A method according to claim 15, wherein an adherent metal layer on the surface of said conductive core material is patterned for use as a mask for said chemical etching.

21. A method according to claim 20, wherein said adherent metal is tin or nickel.

22. A method according to claim 1, wherein said second electrically insulative material is a liquid or a paste prior to application thereof to the conductive core material, and wherein said second electrically insulative material is subjected to processing conditions to effect transition thereof to a substantially void-free solid following application thereof to the conductive core material.

23. A method according to claim 1, wherein said first and/or second electrically insulative material comprises one or more organic compound(s).

24. A method according to claim 23, wherein said organic compound is filled with a particulate material having a lower coefficient of thermal expansion than said organic compound.

25. A method according to claim 24, wherein said particulate is silica, boron nitride, crushed glass, ceramic powders, glass or ceramic hollow spheres, and/or mica or other minerals.

26. A method according to claim 23, wherein said organic compound(s) is selected from the group consisting of epoxies, cyanate esters, polyimides, bismaleimides, cyclic hydrocarbons, polyetherimides, polybenzimidazoles, polyarylethers, polyethersulfones, aromatic polyamides, derivatives and combinations thereof.

27. A method according to claim 1, wherein said first and/or second electrically insulative material comprises one or more inorganic compound(s).

28. A method according to claim 27, wherein said inorganic compound(s) is a glass comprising one or more of lead oxides, soda ash, potash or silica.

29. A method according to claim 1, wherein the coefficient of thermal expansion of said first and second electrically insulative materials is within about $\mp 50$ ppm/° C. of the coefficient of thermal expansion of the conductive core material over a temperature range of about $-100°$ C. tip to about 300° C.

30. A method according to claim 1, wherein the surface of the cavity is contacted with an adhesion-promoting substance prior to step (a) and/or (c).

31. A method according to claim 30, wherein said adhesion promoting substance comprising one or more of an oxide of the core material, an organosilane, an organotitanate, or a chromium-containing compound.

* * * * *